(12) United States Patent
Young

(10) Patent No.: US 7,074,709 B2
(45) Date of Patent: Jul. 11, 2006

(54) LOCALIZED DOPING AND/OR ALLOYING OF METALLIZATION FOR INCREASED INTERCONNECT PERFORMANCE

(75) Inventor: Bradley Scott Young, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 258 days.

(21) Appl. No.: 10/288,974

(22) Filed: Nov. 6, 2002

(65) Prior Publication Data

US 2004/0002211 A1 Jan. 1, 2004

Related U.S. Application Data

(60) Provisional application No. 60/392,715, filed on Jun. 28, 2002.

(51) Int. Cl.
*H01L 21/4763* (2006.01)
*H01L 21/44* (2006.01)

(52) U.S. Cl. .................. 438/625; 438/626; 438/638; 438/654; 438/687

(58) Field of Classification Search ................ 438/625, 438/626, 638, 654, 687; 385/100, 135, 136, 385/137, 123; 242/159, 47, 176
See application file for complete search history.

(56) References Cited

U.S. PATENT DOCUMENTS

| | | | | |
|---|---|---|---|---|
| 4,955,688 A | * | 9/1990 | Chapin et al. ............... | 385/123 |
| 4,995,698 A | * | 2/1991 | Myers ......................... | 385/147 |
| 5,221,060 A | * | 6/1993 | Couvillion et al. .......... | 242/159 |
| 5,594,829 A | * | 1/1997 | LoStracco et al. ........... | 385/134 |
| 5,822,065 A | * | 10/1998 | Mark et al. .................. | 356/465 |
| 6,023,100 A | | 2/2000 | Tao et al. | |
| 6,268,291 B1 | | 7/2001 | Andricacos et al. | |
| 6,376,353 B1 | * | 4/2002 | Zhou et al. .................. | 438/612 |
| 6,387,806 B1 | * | 5/2002 | Wang et al. ................. | 438/687 |
| 6,420,262 B1 | | 7/2002 | Farrar ......................... | 438/652 |
| 2002/0076925 A1 | | 6/2002 | Marieb et al. | |
| 2003/0203617 A1 | * | 10/2003 | Lane et al. .................. | 438/627 |

FOREIGN PATENT DOCUMENTS

| | | |
|---|---|---|
| FR | 2816758 A1 | 5/2002 |
| JP | 2000150522 | 5/2000 |
| WO | WO 0197283 A | 12/2001 |
| WO | WO 0245142 | 6/2002 |

OTHER PUBLICATIONS

C. P. Wang et al., *Binary Cu–alloy layers for Cu–interconnections reliability improvement* (3 pp.).
E. T. Ogawa et al., *Stress–Induced Voiding Under Vias Connected To Wide Cu Metal Leads* (10 pp.).
*Development of electroless copper metallisation*, [online] Retrieved from the Internet:<URL: http://www.hut.fi/Units/Electron/Research/res2000/ElectrolessCu/electroless_copper.html (3 pp.).

* cited by examiner

*Primary Examiner*—William M. Brewster
(74) *Attorney, Agent, or Firm*—Jacqueline J. Garner; W. James Brady, III; Frederick J. Telecky, Jr.

(57) ABSTRACT

Methods and compositions are disclosed for modifying a semiconductor interconnect layer to reduce migration problems while minimizing resistance increases induced by the modifications. One method features creating trenches in the interconnect layer and filling these trenches with compositions that are less susceptible to migration problems. The trenches may be filled using traditional vapor deposition methods, or electroplating, or alternately by using electroless plating methods. Ion implantation may also be used as another method in modifying the interconnect layer. The methods and compositions for modifying interconnect layers may also be limited to the via/interconnect interface for improved performance. A thin seed layer may also be placed on the semiconductor substrate prior to applying the interconnect layer. This seed layer may also incorporate similar dopant and alloying materials in the otherwise pure metal.

17 Claims, 3 Drawing Sheets

US 7,074,709 B2

LOCALIZED DOPING AND/OR ALLOYING OF METALLIZATION FOR INCREASED INTERCONNECT PERFORMANCE

CROSS-REFERENCE TO RELATED APPLICATIONS

This application is entitled to the benefit of a provisional patent application Ser. No. 60/392,715 filed Jun. 28, 2002.

STATEMENT REGARDING FEDERALLY SPONSORED RESEARCH OR DEVELOPMENT

Not applicable.

BACKGROUND OF THE INVENTION

1. Technical Field of the Invention

The present invention generally relates to semiconductor processing techniques. More particularly, the present invention relates to selective modification of the interconnects of an integrated circuit to achieve improved mechanical and electrical properties.

2. Description of Related Art

The semiconductor technology central to the modern integrated circuit ("IC") has been developing for over a century. In the late nineteenth century, the special properties of the semiconductor selenium were first observed and recognized. The field of semiconductor physics advanced rapidly and the first transistor was proposed in the 1930s. However, not until the late 1940s was a functional point contact transistor constructed. The IC, which employs a plurality of circuit elements in a monolithic semiconductor substrate rather than using discrete components, was first developed in the late 1950s by Jack Kilby at Texas Instruments, Inc. and by Robert Noyce at Fairchild Semiconductor Corporation.

Since the late 1950s, IC technology has evolved rapidly and has revolutionized virtually every industry and capacity in which ICs are used. Today's ICs frequently employ hundreds of thousands or even millions of transistors and highly complex, multi-layered architectures. The proliferation of electronics in general, and ICs in particular, has resulted in large part from the ability to increase circuit functionality while simultaneously reducing device cost and size. An important catalyst for these improvements has been advances in semiconductor processing technologies. Although a wide array of semiconductor companies and products exist, for the most part, semiconductor processing is completed through a series of common steps. Semiconductor processing begins with a wafer or substrate, upon which various processing techniques are used to construct circuit elements such as transistors, resistors and capacitors. The formation of circuit elements comprises a process called doping—i.e., deliberately introducing impurities into certain regions of the monolithic crystalline substrate. After the circuit elements are formed, a series of conductive and insulating layers are used to form connections, called interconnects, between the appropriate circuit elements.

As increasingly complex ICs utilize an increasing number of circuit elements, more electrical interconnects between circuit elements and a greater number of conductor-insulator layers are required. A chief objective of semiconductor processing is the minimization of interconnect electrical resistance. Increased resistance is undesirable because as the interconnect resistance between two electrical devices increases, so too does the amount of time it takes a signal to propagate between the devices. This, in turn, decreases the overall speed at which the IC functions. Additionally, increased resistance also increases the amount of overall power consumed by the IC.

Another important consideration is the mechanical stability of the interconnects, which is negatively impacted by a phenomenon known as electromigration, the migration of atoms in the interconnect induced by applying an electric potential across the interconnect. The principle of electromigration is depicted graphically in FIGS. 1A, 1B and 2. FIG. 1A shows an electron flow 14 in a conductor 10 due to a potential difference supplied by a battery 12. The momentum of the electrons in the electron flow 14 causes atoms in the conductor 10 to migrate in the same direction as the electron flow 14. Grain boundaries occur at the intersection between two crystalline grains. The intersection of three or more crystalline grains may be susceptible to electromigration. Consequently, grain boundary 16 and intersection point 18 are likely places for electromigration damage, but usually at higher activation energy than surface diffusion in the case of Cu metallization.

FIG. 1B shows electron flow 14 through grain boundary intersection points 18A and 18B. In intersection point 18A, electron flow 14 from two grains is merging into a single grain, resulting in the formation of void 20. In intersection point 18B, in contrast, electron flow 14 from a single grain is diverging into two different grains, resulting in the formation of hillock 21.

Conductors are often processed using aluminum with a small concentration (i.e., less than about 2% by weight), of Copper ("Cu"). More recently, pure Cu has been the metal of choice for producing metal interconnect on ICs. To contain the Cu and keep it from entering and moving within the glass dielectric layers and the active areas of the substrate, barrier layers surround the Cu. These barriers are carefully chosen so as to not cause adhesion problems between the metallization and the encapsulating/insulating dielectric layers. With the advancement of technology, new materials are sought to reduce parasitic capacitance and resistance for greater circuit performance and lower power consumption. These new materials possess lower dielectric constants but also lower thermal conductance. This reduces the efficiency with which heat is transferred to the substrate. Also, these material are more brittle and mechanically less robust than the more traditional silicone dioxide. Lower mechanical strength means less resistance to cracking and possibly a greater tendency toward electromigration, due to tensile forces on the metallization or lower strength in general. The surface between the Cu lead and the barrier is observed to be a path for metal movement of relatively low activation energy. Voids can nucleate and/or grow at this surface, and the other interfacial surfaces. Metal will electromigrate, that is, drift or diffuse in the direction of electron flow under electrical bias. Voids, depletion of metal in an area, can form near the electron source. These voids are usually paired downstream with hillocks, an accumulation of metal. Hillocks can cause the formation of metal filaments into the dielectric, that is, unwanted paths of current leakage, and even cracking of the barrier and/or dielectric.

The impact on circuit performance of void 20 and hillock 21 in FIG. 1 is depicted graphically in FIG. 2. FIG. 2 shows interconnect 23 and parallel interconnect 24, which is desirably electrically isolated from interconnect 23. Proper circuit performance requires not only high electrical conductance along interconnect 23 and interconnect 24 but a high electrical resistance between them. Void 20 and hillock 21 can impact both the electrical conductance along a single interconnect and the electrical resistance between two different interconnects. For example, void 20 in interconnect 23 can significantly decrease the electrical conductance along interconnect 23. Similarly, hillock 21 can create a short between interconnect 23 and interconnect 24, thereby destroying the electrical isolation between the two interconnects.

Voids can also arise from stress. Interconnects frequently abut adjacent layers formed at different temperatures. For example, a copper interconnect deposited at room temperature may adjoin a carbide layer formed at around 400° C., thereby causing an inherent stress. Tensile stresses in the interconnect tend to pull the interconnect material apart (causing voids) as the interconnect changes temperatures, further exacerbating migration problems. This effect is more prevalent at the interface between adjacent layers. Furthermore, this stress voiding at the interfacial surfaces is even more problematic at elevated temperatures and/or under heavy current flow.

Until recently, aluminum was the interconnect conductor of choice in IC processing. The popularity of aluminum stemmed from a variety of factors. First, techniques for depositing thin aluminum films are well established. Second, because aluminum can be etched effectively in chlorine plasmas, the formation of patterned aluminum films is relatively straightforward. Unfortunately, though, aluminum interconnects have several drawbacks. First, from an electrical perspective, aluminum is relatively poor conductor relative to other metals. Consequently, aluminum negatively impacts circuit speed and power usage. Second, from a mechanical perspective, aluminum is particularly susceptible to structural problems resulting from electromigration and stress. For years, the semiconductor industry has been moving away from aluminum metallization. Initial efforts included adding trace amounts of copper to the aluminum, because the copper had a lower resistivity and was less susceptible to electromigration. With each successive generation of ICs more copper was added.

Currently, the semiconductor industry is transitioning to pure—or relatively pure—copper as the electrical conductor of choice for establishing interconnections between circuit elements. Copper has a significantly higher conductivity than aluminum and is inherently more resistant to electromigration. Procedures such as chemical mechanical polishing ("CMP") are facilitating the shift to copper metallization. In general, CMP involves planarizing surface layers that have been deposited on a semiconductor wafer.

While the shift to copper interconnects has alleviated some of the problems associated with aluminum metallization, it has not eliminated them. Although less susceptible, copper also suffers from electrically-induced and stress-induced migration problems. Electromigration problems with copper were recently discussed in "Binary Cu-Alloy Layers for Cu-Interconnections Reliability Improvement" by Connie P. Wang et al. (hereinafter "Wang"). According to Wang, current techniques for dealing with electromigration problems in copper interconnects include the use of copper alloys that exhibit improved structural stability over pure copper. In general, Wang's approach involves selecting copper alloys, rather than copper, to fill the interconnect trench. Because copper alloys frequently exhibit increased electrical resistance to current flow, Wang focused on those copper alloys possessing suitably low electrical resistance. Using this criteria, Wang limited the copper alloy materials to CuSn, CuIn, and CuZr, for which the additional sheet resistance ranges from 1.1–18 $\mu\Omega$-cm.

The use of copper alloys rather than copper creates several problems. First, copper interconnects comprised entirely of these copper alloys (e.g., CuSn, CuIn, CuZr, etc.) exhibit larger sheet resistances than pure copper interconnects. This added electrical is especially problematic for long thin metal interconnects.

Second, the copper alloys disclosed by Wang are not conventionally used in other manufacturing steps. Consequently, these materials raise process integration issues and likely would lead to significantly increased manufacturing costs.

A need still exists for improved copper metallization that possesses improved mechanical stability without increased electrical resistance.

BRIEF SUMMARY OF THE PREFERRED EMBODIMENTS

The preferred embodiments of the present invention involve modifications to the interconnects that enhance their mechanical stability. Unlike the disclosure of Wang, however, the surface of the interconnect is modified rather than the bulk interconnect. Consequently, the interconnect benefits from the mechanical stability of a robust modified exoskeleton while retaining the electrical properties of the unmodified interconnect material.

According to one preferred embodiment of the present invention, an interconnect layer is modified by implanting ions in the vicinity of the via/interconnect interface. After the interconnect is deposited and planarized by CMP, an ion implantation step is performed in the area patterned by a mask. Preferably, the mask restricts ion implantation to the vicinity of the interconnect/via interface. In one embodiment the interconnect is copper and the chemical species introduced is selected from the group consisting of arsenic, antimony, chromium, palladium, tin, magnesium, aluminum, cobalt, and zirconium, and combinations thereof. Preferably, modification depth varies between about 50 and 500 Angstroms and the composition of chemical species in this depth range vanes between about 0.1 and about 10 percent by weight.

According to another preferred embodiment of the present invention, an alloy layer is deposited on top of an interconnect after a trench has been formed in the interconnect (possibly by etching). In using an etch step, the etch step may be selective—i.e., confined to a specific area in the vicinity of the interconnect/via interface—or may apply generally to the entire interconnect. The trench may also be formed in the interconnect layer by using over-polishing during a CMP step. In one embodiment, interconnect is copper, and the alloy layer is a copper alloy comprising copper and a material selected from the group consisting of arsenic, antimony, chromium, palladium, tin, magnesium, aluminum, cobalt, and zirconium, or combinations thereof. Preferably, the thickness of alloy layer, or the depth of the trench in interconnect, varies between 50 and 500 Angstroms, and the percent composition of the material added to the copper varies between about 0.1 and about 10 percent by weight.

Various techniques exist for depositing the alloy layer. One embodiment includes electroless plating, where metal deposition occurs through a chemical reduction reaction from an aqueous metal salt solution, which also contains a reducing agent. The semiconductor wafer is immersed in a plating bath, wherein metal ions react with reducing agents on a catalytic surface, thereby enabling selective plating on interconnects that are electrically isolated.

Other preferred embodiments for depositing alloy layer include vapor deposition techniques such as Chemical Vapor Deposition ("CVD") and Physical Vapor Deposition ("PVD"). These techniques are referred to as gross deposition techniques because there is no selectivity of deposition and a film of the material to be deposited forms over the whole surface of the wafer. Accordingly, one embodiment that uses vapor deposition techniques to form the alloy layer may involve a CMP step after depositing the alloy layer in order to maintain electrical isolation between interconnects. Another method of maintaining electrical isolation between interconnects while using vapor deposition techniques includes employing a mask to limit the deposition of the desired material to only the exposed interconnect layers. More particularly, the mask may limit the deposition of the desired material to the vicinity of the interconnect/via interface.

Another embodiment of the present invention involves selective application of a thin seed layer, on the order of about 10 to 50 Angstroms thick, in the trench prior to application of an interconnect layer. In this manner, the walls of the trench are coated with the thin seed layer. In one embodiment, the interconnect is copper and thin seed layer is a copper alloy comprising copper and a material selected from the group consisting of arsenic, antimony, chromium, palladium, tin, magnesium, aluminum, cobalt, and zirconium and combinations thereof Preferably, the deposition of alloy layer is accomplished using the selective electroless plating techniques described above. Another embodiment includes depositing the alloy layer using atomic layer growth methods.

BRIEF DESCRIPTION OF THE DRAWINGS

For a more detailed description of the present invention, reference will now be made to the accompanying drawings, wherein.

DETAILED DESCRIPTION OF PREFERRED EMBODIMENTS

The preferred embodiments of the present invention stem from the realization that interconnect mechanical stability can be increased—and, therefore, interconnect susceptibility to electromigration and stress migration decreased—without compromising interconnect electrical conductivity by selectively modifying the periphery of the individual metal lead. The modified periphery limits void and hillock formation while the inner core of the interconnect serves as a high conductance pathway for current flow. As would be evident to a person of ordinary skill, numerous methods exist for the selective modification of interconnects. Therefore, without limiting the scope of the present invention, some preferred embodiments involve modification of the interconnect periphery selectively implanting or diffusing one or more desired chemical species into the exterior surface of an interconnect. According to some other preferred embodiments of the present invention, the modified periphery is generated by depositing one or more chemical species onto the exterior surface of an interconnect.

The preferred embodiments of the present invention are generally applicable to interconnects in any type of integrated circuit processing and construction. Therefore, without limiting the scope of the invention, the preferred embodiments involve modifications to a CMP process for damascene construction.

Damascene Construction

Figure 1A:
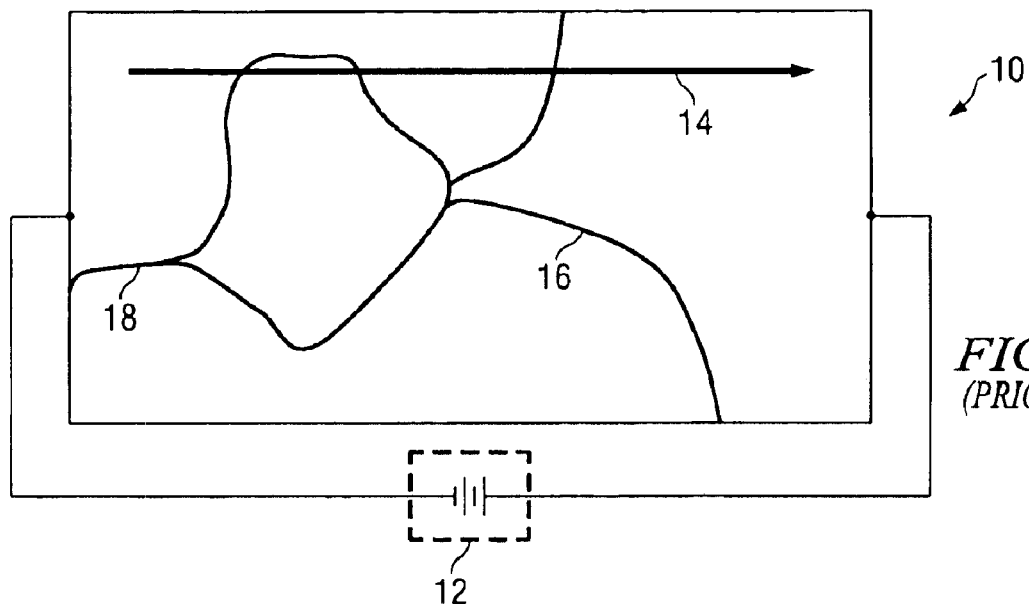
FIG. 1A shows a conductor including grain boundaries.
Figure 1B:
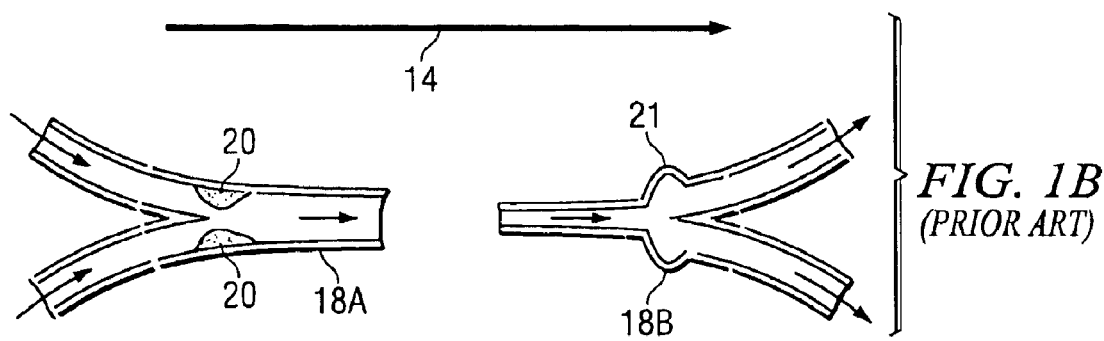
FIG. 1B shows grain boundary intersection points.
Figure 2:
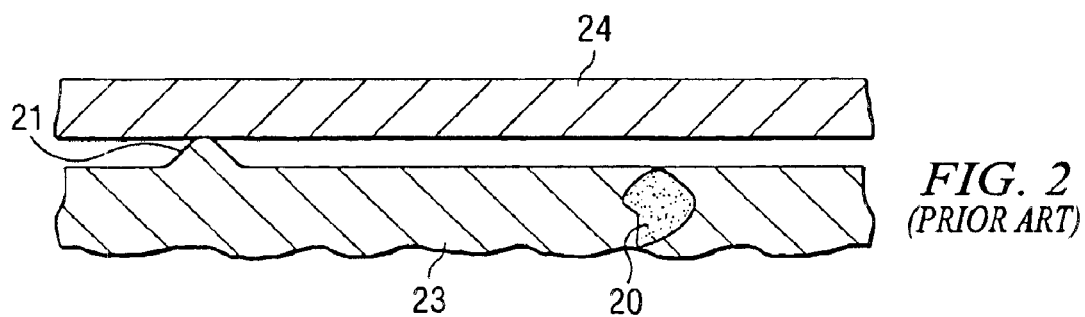
FIG. 2 shows possible failure modes resulting from atomic migration.
Figure 3A:
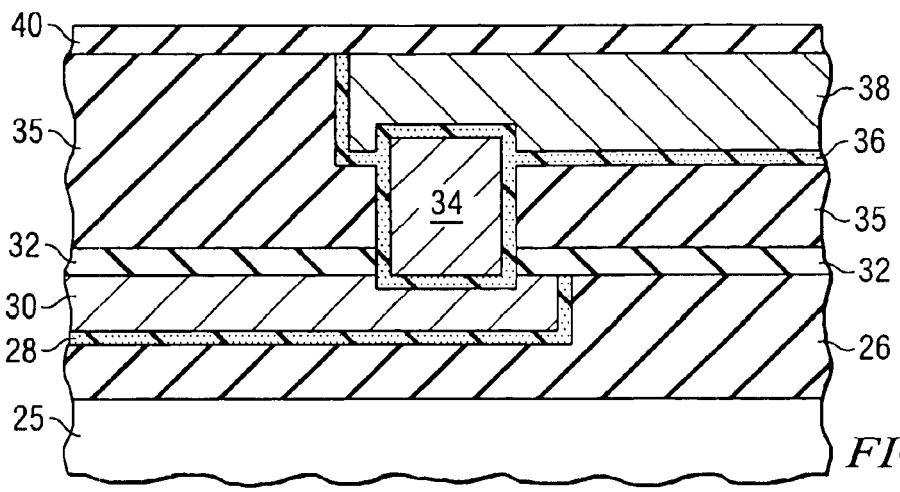
FIG. 3A shows a single damascene structure.
Figure 3B:
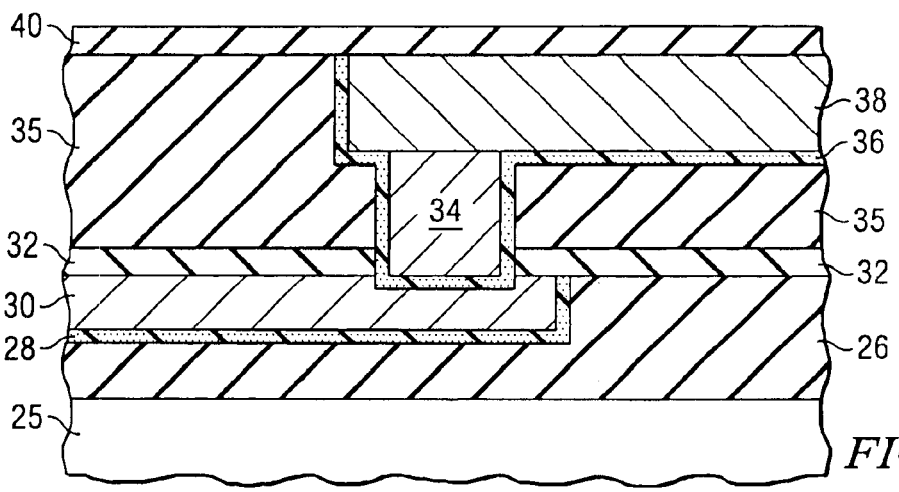
FIG. 3B shows a dual damascene structure.

Damascene interconnect construction derives its name from the ancient artisans of Damascus, who created intricate patterns using metal inlays. Akin to its ancient origins, damascene construction in semiconductor processing creates interconnect lines by etching a recess or trench in a planarized insulator layer, filling the trench with a encapsulating/containment barrier metal and the lead metal (e.g., aluminum or copper), and then removing excess metal material by planarization to yield a damascene structure. FIGS. 3A and 3B show cross sections of an IC employing damascene construction. FIG. 3A shows "single damascene" construction whereas FIG. 3B shows "dual damascene" construction.

FIG. 3A depicts a semiconductor substrate 25 having disposed thereon patterned insulator and interconnect layers. Inter-layer dielectric ("ILD") 26 contacts semiconductor substrate 25 and provides electrical insulation between semiconductor substrate 25 and first interconnect 30. Barrier layer 28 limits diffusion of chemical species between ILD 26 and first interconnect 30. Capping layer 32, typically an insulator, covers ILD 26 and first interconnect 30 except where via 34 and barrier layer 36 connect first interconnect 30 to second interconnect 38. ILD 35 provides additional electrical isolation between first interconnect 30 and second interconnect 38. Capping layer 40 provides both electrical isolation and surface protection to the completed integrated circuit.

Damascene construction typically begins with semiconductor substrate 25. ILD 26 is deposited on semiconductor substrate 25 and planarized using CMP. Numerous materials can be employed effectively as ILDs in semiconductor processing. Therefore, without limiting the scope of the present invention, the preferred embodiments of the present invention employ silica-containing materials such as organosilica glasses or doped silica such as fluorine-doped silica glasses.

After planarization of the ILD 26, a trench is etched in ILD 26 and a barrier layer 28 is deposited in the trench followed by first interconnect 30. In general, barrier layers serve to hinder the metal (e.g., copper) from diffusing into adjacent ILDs. The material deposited to form barrier layer 28 generally depends on the chemical composition of the interconnect. For example, when first interconnect 30 comprises tungsten (W), barrier layer 28 typically comprises titanium (Ti)—e.g., Ti, titanium nitride (TiN), or a Ti/TiN stack. However, when first interconnect 30 comprises copper (Cu), barrier layer 28 typically comprises tantalum (Ta)—e.g., Ta, tantalum nitride (TaN) or a Ta/TaN stack. According to one preferred embodiment, first interconnect 30 comprises copper and barrier layer 28 comprises Ta or TaN or Ta/TaN bilayer, and possibly another layer to increase adhesion between the TaN and the dielectric.

Following the application of the barrier layer 28, first interconnect 30 is deposited and then planarized using CMP. As mentioned above, metal interconnects typically comprise aluminum or copper but may be any material, including metal alloys, that exhibit satisfactory electrical and mechanical properties.

Capping layer 32 preferably is deposited on first interconnect 30 and ILD 26 following planarization. Capping layer 32 typically comprises an insulating capping film, silicon nitride or silicon carbide, and may be patterned using photolithography techniques so as to leave an opening for via 34. As shown in FIG. 3A, via 34 may be surrounded by barrier layers. Via 34 may comprise the same type of metal used in first interconnect 30 or may be a different material altogether.

ILD layer 35 (which may or may not be of the same composition as ILD 26) is then deposited on top of capping layer 32, and preferably is further patterned (or etched) to allow for via 34, barrier layer 36, and second interconnect 38. The patterning step for ILD 35 and the patterning step for capping layer 32 may be combined in order to speed up fabrication time. The composition of barrier layer 36, like barrier 28, is typically selected based upon the materials surrounding it (i.e., via 34), and may therefore comprise the same material as barrier 28 described above.

Second interconnect 38 fills the remaining trench created in ILD 35. Second interconnect 38 may be of the same material as first interconnect 30 and/or via 34, or may be a completely different material altogether. For example, first interconnect 30 and second interconnect 38 may be comprised of copper while via 34 may be comprised of tungsten. Capping layer 40 is applied above second interconnect 38 following planarization. Although not specifically shown in FIG. 3A, capping layer 40 may be patterned, like capping layer 32, in anticipation of subsequent interconnect layers. The semiconductor structure shown in FIG. 3A is referred to as a "single damascene" or damascene structure because via 34 and second interconnect 38 are formed in separate steps.

FIG. 3B, in contrast to FIG. 3A, depicts a "dual damascene" structure in which via 34 and second interconnect 38 are formed in a single step and there is no barrier separating them. In this case, via 34 and second interconnect 38 typically comprise the same material (e.g., copper). Note that the term "trench" and "recess" are used synonymously herein to indicate a void that may be created in any layer. Furthermore, a recess may include additional trenches, for example, in FIG. 3A the electrically-insulating layer 35 may have a recess that comprises a secondary trench created for via 34 and a primary trench created for interconnect 38.

Interconnect Failure Due to Migration

When current flows in the interconnect, the momentum due to electron flow cause the atoms of the interconnect to migrate in the direction of electron flow along grain boundaries. This migration pattern sometimes results in voids (depletions in the conductor at grain boundary intersection point) and hillocks (accumulation of atoms in the conductor at grain boundary intersection points). The voids and hillocks produced by electromigration may lead to the failure of an IC by causing open circuits and short circuits of interconnects, respectively.

Interconnect migration failure may also be the result of stress induced voiding as observed in "Stress Induced Voiding Under Vias Connected to Wide Cu Metal Leads" by E. T. Ogawa et al., which is hereby incorporated by reference. In general, interfacial surface stress, or the stress that exists at the seam of two adjacent layers, is thermally induced and is further exacerbated by electrical stresses. As temperatures and electric stresses fluctuate, the inherent interfacial stress can cause voids at the seam of adjacent layers.

Voiding resulting from both stress migration and electromigration is especially problematic where the via surface meets the interconnect surface in damascene construction. It is believed that many migration failures occur in the vicinity of the via/interconnect interface. From an electromigration standpoint, as electrons flow from the via to the interconnect or vice versa, the electrons are required to "turn the corner"—i.e., to abruptly change their direction of flow to a narrower path. The reduction of electron path width increases electrical resistance and current crowding, resulting in the heating of the via/interconnect interface and increasing the susceptibility of the interface to migration problems. From a stress-induced migration standpoint, because the barrier, via, and interconnects are typically deposited under different pressures and temperatures, an inherent stress mismatch exists between these adjacent layers that is agitated by increases in temperature. Thus, electromigration and stress-induced migration combine synergistically to accelerate failure conditions at via/interconnect interface.

Operation

To combat the susceptibility of interconnects to stress-induced migration and electromigration, the preferred embodiments of the present invention involve modifications to the interconnects that enhance their mechanical stability. The surface of the interconnect is modified rather than the bulk interconnect. Consequently, the interconnect benefits from mechanical stability while retaining the electrical properties of the unmodified interconnect material. A number of preferred embodiments are disclosed herein that relate in general to damascene construction and more particularly to specific surfaces on interconnects. Additionally, as will be understood by a person of skill, the techniques and modifications described herein are applicable to any interconnect in an integrated circuit.

Figure 4:
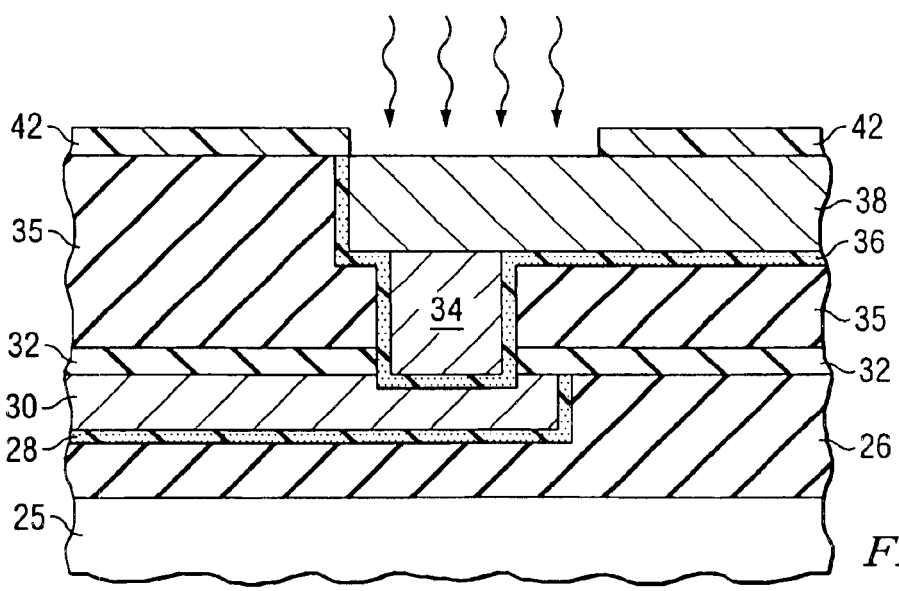
FIG. 4 shows modifying an interconnect layer using ion implantation.

According to one preferred embodiment of the present invention, an interconnect layer is implanted with ions in the vicinity of the via/interconnect interface. Referring to FIG. 4, the dual damascene structure of FIG. 3B is shown prior to application of the capping layer 40. After the second interconnect 38 is deposited and planarized by CMP, an ion implantation step is performed in the area patterned by mask 42. Preferably, mask 42 restricts ion implantation to the vicinity of the interconnect/via interface. Alternatively, a chemical species may be introduced into second interconnect 38 by diffusion or by sputtering. In one embodiment, second interconnect 38 is copper and the implanted material is selected from the group consisting of arsenic, antimony, chromium, palladium, tin, magnesium, aluminum, cobalt, and zirconium, and combinations thereof. Preferably, implantation depth varies between about 50 and 500 Angstroms and the composition of implanted material in this depth range varies between about 0.1 and about 10 percent by weight.

Figure 5:
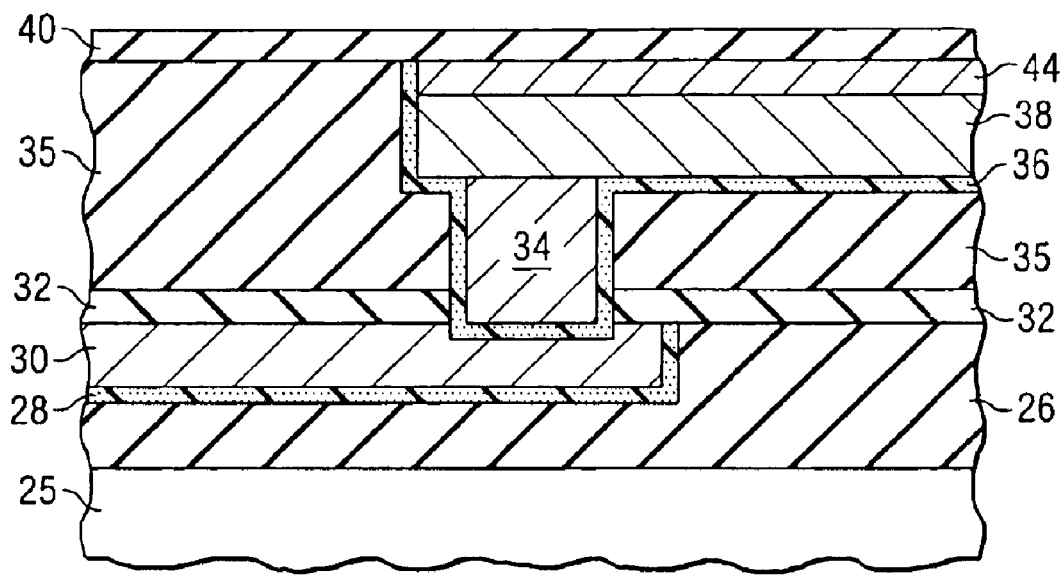
FIG. 5 shows modifying an interconnect layer by filling a trench.

According to another preferred embodiment of the present invention, an alloy layer is deposited on top of second interconnect 38 as shown in FIG. 5. Referring now to FIG. 5, the dual damascene structure of FIG. 3B is shown in which second interconnect 38 has been etched to create a trench and alloy layer 44 has been applied to the trench. The etch step may be selective—i.e., confined to a specific area in the vicinity of the interconnect/via interface—or may apply generally to the entire second interconnect 38. In one embodiment, second interconnect 38 is copper, alloy layer 44 is a copper alloy comprising copper and a material selected from the group consisting of arsenic, antimony, chromium, palladium, tin, magnesium, aluminum, cobalt, and zirconium, or combinations thereof. Preferably, the thickness of alloy layer 44, or the depth of the trench in second interconnect 38, varies between 50 and 500 Angstroms, and the percent composition of the material added to the copper varies between varies between about 0.1 and about 10 percent by weight. Preferably, after alloy layer 44 is applied, a CMP step is performed prior to applying capping layer 40.

As will be evident to a person of ordinary skill, numerous techniques exist for depositing alloy layer 44. One embodiment includes electroless plating. Electroless plating involves metal deposition through a chemical reduction reaction from an aqueous metal salt solution containing also a reducing agent. Deposition temperature is typically between 30 to 80° C. No external power supply is necessary for the metal reduction reaction. The semiconductor wafer is immersed in a plating bath, wherein metal ions react with reducing agents on a catalytic surface, thereby enabling plating on interconnects that are electrically isolated. Depositing alloy layer 44 in this manner is advantageous because alloy layer 44 is selectively applied to the desired interconnect.

Other preferred embodiments for depositing alloy layer 44 include vapor deposition techniques such as Chemical Vapor Deposition ("CVD") and Physical Vapor Deposition ("PVD"). In general, these techniques involve using a volatile chemical species to create a film at the surface of the semiconductor substrate. These techniques are referred to as gross deposition techniques because there is no selectivity of deposition and a film of the material to be deposited forms over the whole surface of the wafer. Accordingly, one embodiment that uses vapor deposition techniques to form alloy layer 44 may involve a CMP step after depositing the alloy layer 44 in order to maintain electrical isolation between metal interconnects. Another method of maintaining electrical isolation between metal interconnects while using vapor deposition techniques includes employing a mask to limit the deposition of the desired material to only the exposed metal layers. More particularly, the mask may limit the deposition of the desired material to the vicinity of the interconnect/via interface.

In yet another embodiment, the trench formed prior to the application of alloy layer 44 may be formed by over-polishing during a CMP step, with a desired trench depth of 50 to 500 Angstroms. Traditionally, after second interconnect 38 is deposited, a CMP step may be performed to polish the final surface, and over-polishing used to create the trench in the second interconnect 38 for the alloy layer 44 may be accomplished during this traditional CMP step.

Figure 6:
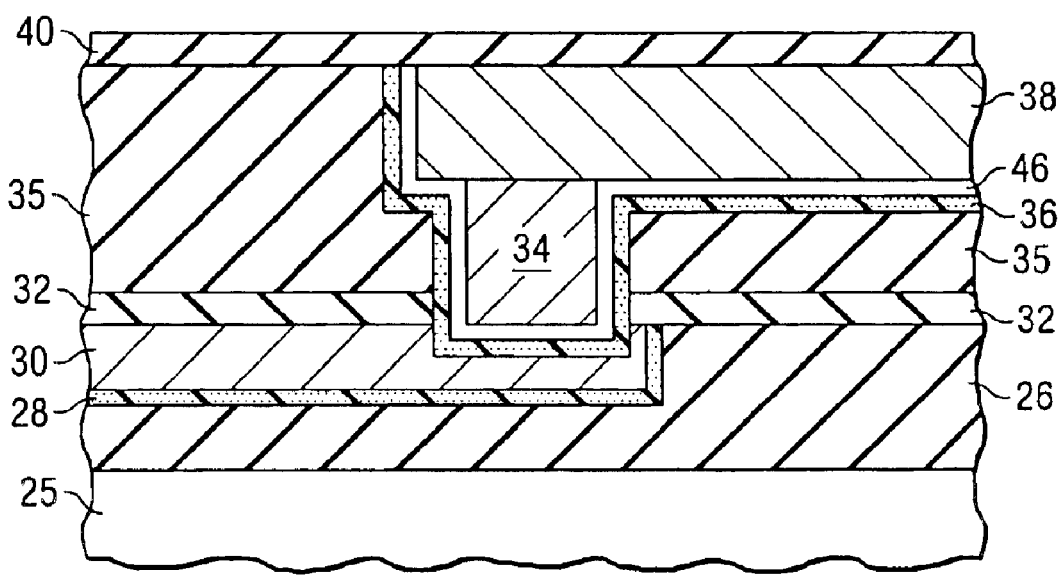
FIG. 6 shows modifying an interconnect layer by applying a thin seed layer.

Another embodiment of the present invention involves selective application of a thin seed layer, on the order of about 10 to 50 Angstroms thick, in the trench so as to coat the walls of the trench with the thin seed layer 46 as shown in FIG. 6. In one embodiment, second interconnect 38 is copper and thin seed layer 46 is a copper alloy comprising copper and a material selected from the group consisting of arsenic, antimony, chromium, palladium, tin, magnesium, aluminum, cobalt, and zirconium and combinations thereof Preferably, the deposition of alloy layer 46 is accomplished using the selective electroless plating techniques described above. Also, alloy layer 46, as shown in FIG. 6, or layer 44 in FIG. 5, may be deposited using atomic layer growth methods.

As described above, interfacial stresses at the boundaries between adjacent materials that cause metal migration are more easily activated than other migration inducing phenomena, or have the lower "activation energy." Typically, metal layers are about 3000 Angstroms thick, and modifying them to a depth of 500 Angstroms maximum still leaves at least 80% of the metal layer unmodified. Thus, implantation and deposition methods of the preferred embodiments advantageously modify the interconnect where the interconnect is most susceptible to migration, at the interface between adjacent layers. Also, because the modified interconnect of the preferred embodiments is not comprised entirely of the alloy material, as was the case in Wang, the overall sheet resistance is decreased. This resistance savings benefit has a more pronounced affect on longer interconnects, and is especially beneficial when the modification is limited to the via/interconnect interface because the span in between vias remains unmodified. As a result of selective modification (through electroless deposition and masking), the concerns of selecting materials with minimal resistance contribution are lessened and therefore more materials such as arsenic and antimony are available for selective implantation, or deposition. Also, the use of arsenic and antimony is beneficial because they are more common in semiconductor IC fabrication and would therefore be easier to implement as disclosed.

An additional benefit of some of the preferred embodiments of the present invention is galvanic corrosion protection. During the course of integrated circuit processing—e.g., during CMP processing—both copper surfaces and barrier metal surfaces may be exposed. Differences in the galvanic potentials of the exposed metals can give rise to a type of corrosion in which the more easily oxidized metal is etched from the wafer surface. This phenomenon is frequently referred to as galvanic corrosion. Because of its galvanic potential, copper is particularly susceptible to galvanic corrosion. Generally speaking, the modification of the top of the interconnect layer according to some of the preferred embodiments, results in copper interconnects with reduced susceptibility to corrosion.

Also, providing a metal migration inhibiting exterior surface for the interconnect according to the preferred embodiments of the present invention impedes metal movement, thereby eliminating the need for a separate barrier. This could be especially beneficial in next generation ICs, which will likely employ narrower vias so that removing the barrier layer at the bottom and or top surfaces of the via will be particularly desirable.

Note that there are often many interconnect layers processed in manufacturing an IC, and the embodiments disclosed herein may be applied to any or all of those interconnect layers as deemed necessary. For example, the IC designers may note a metal migration problem at the first interconnect layer, while the other metal layers do not exhibit such behavior. In this case, an alloy layer may be employed at the first interconnect according to the embodiments disclosed herein, thereby reducing the potential for excessive limitations of the maximum allowed current density design guidelines for metal interconnect.

While the preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention.

Accordingly, the scope of protection is not limited by the description set out above, but is only limited by the claims which follow, that scope including all equivalents of the subject matter of the claims. Each and every claim is incorporated into the specification as an embodiment of the present invention. Thus the claims are a further description and are an addition to the preferred embodiments of the present invention. Use of the term "optionally" with respect to any element of a claim is intended to mean that the subject element is required, or alternatively, is not required. Both alternatives are intended to be within the scope of the claim. The discussion of a reference in the Description of Related Art is not an admission that it is prior art to the present invention, especially any reference that may have a publication date after the priority date of this application. The disclosures of all patents, patent applications and publications cited herein are hereby incorporated herein by reference, to the extent that they provide exemplary, procedural or other details supplementary to those set forth herein.

What is claimed is:

1. A method for constructing an electrical interconnect having enhanced mechanical properties on a semiconductor substrate, comprising:
    formation of a first recess in an electrically-insulating material;
    deposition of a first electrically-conductive material in the first recess, wherein said first electrically-conducting material comprises a metal;
    formation of a second recess in the first electrically-conductive material; and
    deposition of a second electrically-conductive material in the second recess in direct contact with the first electrically-conductive material, wherein said second electrically-conducting material comprises an alloy of copper and arsenic.

2. The method of claim 1, wherein the second electrically-conductive material is deposited by electroless plating.

3. The method of claim 2, wherein the depth of the second recess is in the range of about 50 to about 500 Angstroms.

4. The method of claim 1, wherein copper is present in the second electrically-conductive material at a concentration of between about 95 and about 99.9 weight percent.

5. The method of claim 1, wherein the deposition of the second electrically-conductive material by a vapor deposition technique.

6. The method of claim 1, wherein the formation of the second recess results at least in part from chemically etching the first electrically-conductive material.

7. The method of claim 1, wherein the formation of the second recess results at least in part from over polishing during a chemical mechanical polish ("CMP") step.

8. The method of claim 1, wherein the first recess comprises a secondary trench overlying a primary trench and wherein the second recess in the first conductive material is located primarily above the primary trench.

9. A method for constructing an electrical interconnect having enhanced mechanical properties on a semiconductor substrate, comprising:
    formation of a first recess in an electrically-insulating material;
    deposition of a thin seed layer of a first electrically-conductive material in the first recess;
    deposition of a second electrically-conductive material in the first recess, wherein said second electrically-conductive material comprises a metal;
    chemical-mechanical polish of said second electrically-conductive material;
    after said chemical-mechanical polish, formation of a second recess in the second electrically-conductive material by etching; and
    deposition of a third electrically-conductive material in the second recess in direct contact with said second electrically-conductive material, wherein said third electrically-conductive material comprises an alloy including said metal.

10. The method of claim 9, wherein the deposition of the thin seed layer occurs by electroless plating.

11. The method of claim 9, wherein the deposition of the third electrically-conductive material occurs by electroless plating.

12. The method of claim 10, wherein the thin seed layer has a thickness in the range of about 10 to about 50 Angstroms.

13. The method of claim 10, wherein the first and third electrically-conductive materials comprise copper and a material selected from the group consisting of arsenic, antimony, chromium, palladium, tin, magnesium, aluminum, cobalt, and zirconium.

14. The method of claim 13, wherein the first and the third electrically-conductive materials contain an amount of non-copper material in the range of about 0.1 to about 10.0 percent by weight.

15. The method of claim 10, wherein the second recess has a depth in the range of about 50 to about 500 Angstroms.

16. The method of claim 9, wherein the deposition of the thin seed layer occurs by atomic layer growth.

17. The method of claim 9, wherein the first recess comprises a secondary trench overlying a primary trench and wherein the second recess is located primarily above the primary trench.

* * * * *